United States Patent
Liang et al.

(10) Patent No.: US 9,627,332 B1
(45) Date of Patent: Apr. 18, 2017

(54) INTEGRATED CIRCUIT STRUCTURE AND SEAL RING STRUCTURE

(71) Applicant: TAIWAN SEMICONDUCTOR MANUFACTURING COMPANY LTD., Hsinchu (TW)

(72) Inventors: Shih-Wei Liang, Taichung County (TW); Hsien-Ming Tu, Hsinchu County (TW); Ching-Jung Yang, Taoyuan County (TW); Chang-Pin Huang, Taoyuan County (TW); Yu-Chia Lai, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/017,114

(22) Filed: Feb. 5, 2016

(51) Int. Cl.
*H01L 23/00* (2006.01)

(52) U.S. Cl.
CPC ................................ *H01L 23/564* (2013.01)

(58) Field of Classification Search
CPC ..................................................... H01L 23/546
See application file for complete search history.

(56) References Cited

U.S. PATENT DOCUMENTS

2005/0087878 A1    4/2005   Uesugi et al.

*Primary Examiner* — Dung Le
(74) *Attorney, Agent, or Firm* — WPAT, P.C., Intellectual Property Attorneys; Anthony King (57) ABSTRACT

An integrated circuit structure with seal ring structure is provided. The seal ring structure includes a low k dielectric layer, a first seal ring and a second seal ring. The first seal ring and the second seal ring are spaced from each other. Each of the first seal ring and the second seal ring comprises a metal layer. The metal layer is embedded in the low k dielectric layer, and the metal layer includes a body pattern having a plurality of openings. The area ratio of the body pattern to the metal layer of the first seal ring and the second seal ring is greater than or equal to 50% and less than 100%.

20 Claims, 7 Drawing Sheets

INTEGRATED CIRCUIT STRUCTURE AND SEAL RING STRUCTURE

BACKGROUND

Seal ring formation is an important part in the back-end of semiconductor processes. Seal rings are stress protection structures around integrated circuits (ICs), protecting the internal circuit inside semiconductor chips from damage caused by the sawing of the semiconductor chips from wafers. Seal rings are also used to protect the IC from moisture degradation and ionic contamination.

As the size of electronic devices has decreased, the robustness of seal ring structure is weakened as well. Accordingly, seal ring structure with higher robustness and protection ability is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, an integrated circuit structure and a semiconductor device having a seal ring structure are provided. The seal ring structure is formed between semiconductor chip and scribe line prior to sawing. The seal ring structure is configured to protect the semiconductor chip from being attacked by moisture. The seal ring structure requires sufficient mechanical strength to bear the stress during sawing, such that it can protect the semiconductor chip in use. The metal layer(s) of the seal ring structure with grid pattern design prevents the metal layer from metal dishing during CMP operation while maintaining sufficient mechanical strength. Accordingly, requirements for reliability, moisture blocking ability and robustness are fulfilled.

In the present disclosure, the area ratio of the openings to the metal layer is within a specific range e.g. substantially greater than 0% and less than or equal to 50%. Within this ratio range, the metal layer of the seal ring structure is able to avoid metal dishing issue, provide enough mechanical robustness and maintain sufficient moisture blocking ability at the same time.

Figure 1A:
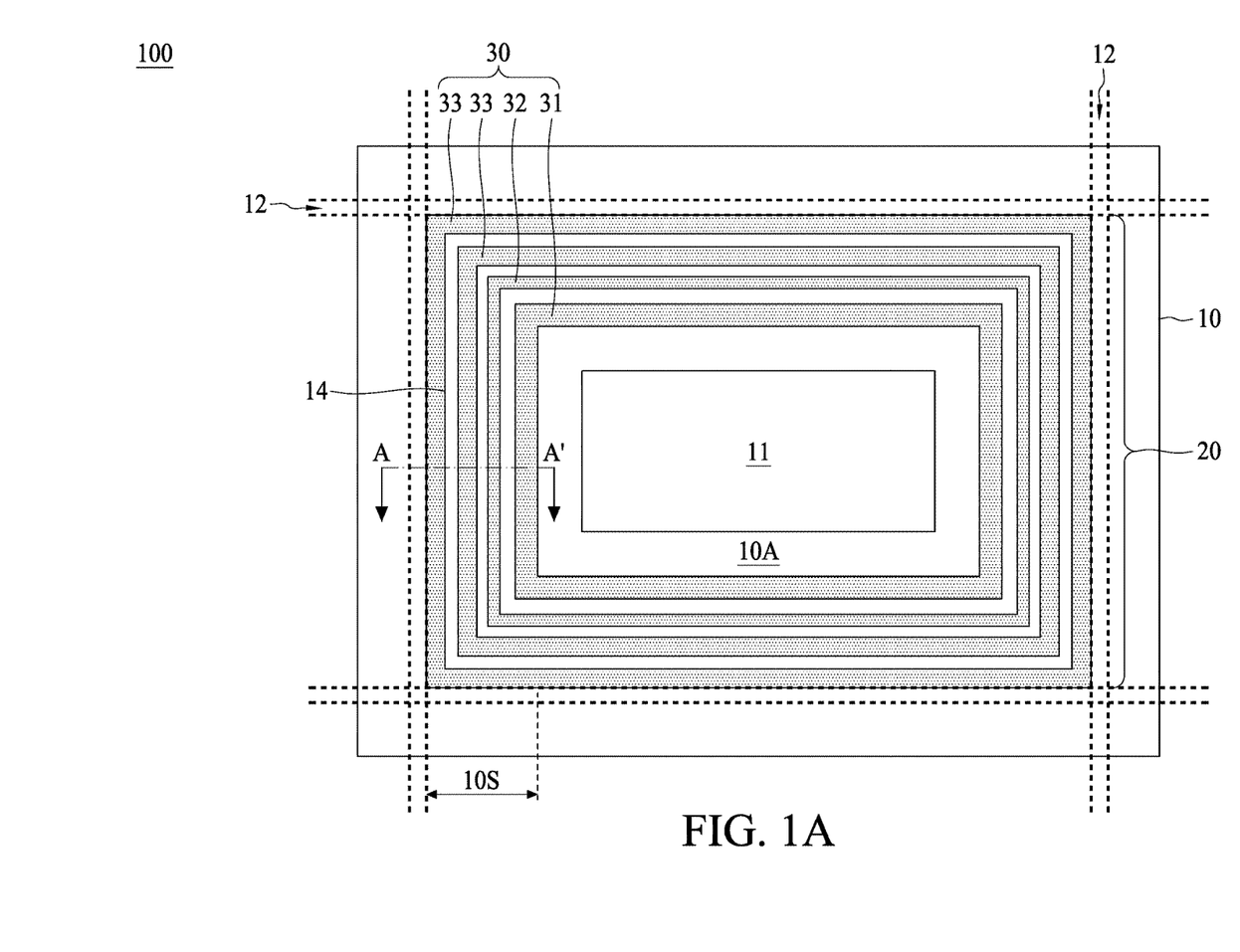
FIG. 1A is a schematic top view of some embodiments of an integrated circuit structure.
Figure 1B:
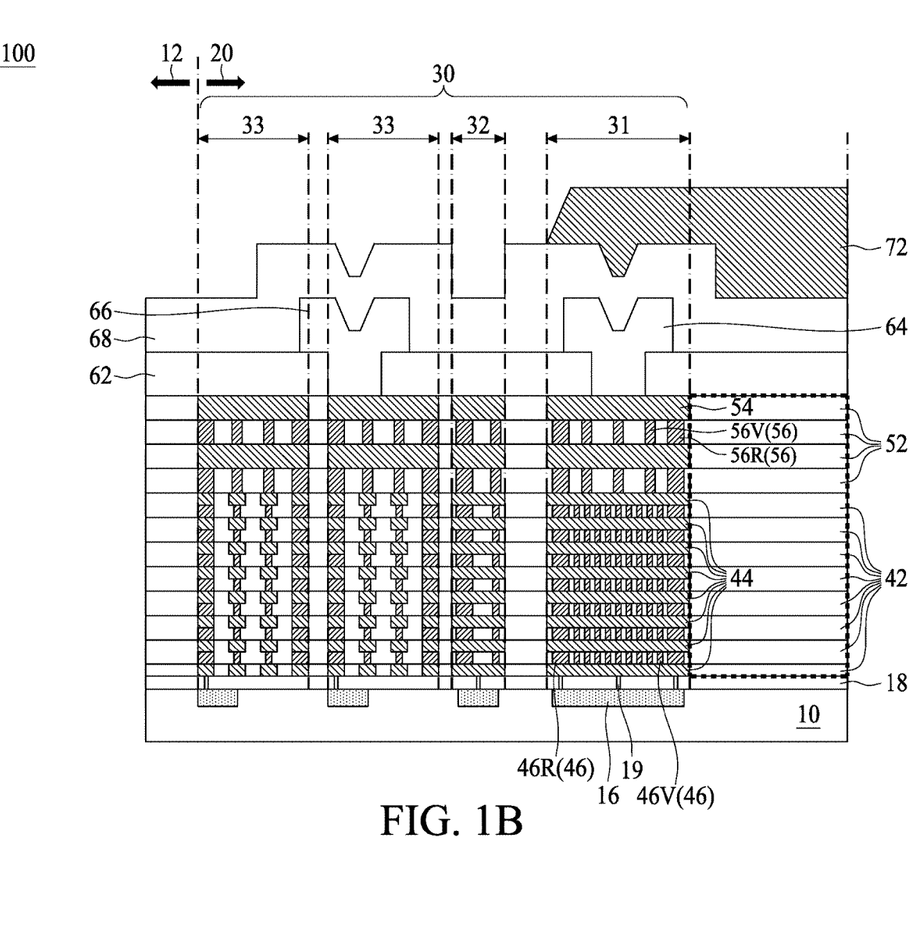
FIG. 1B is a schematic cross-sectional view taken along a line A-A' in FIG. 1A.
Figure 1C:
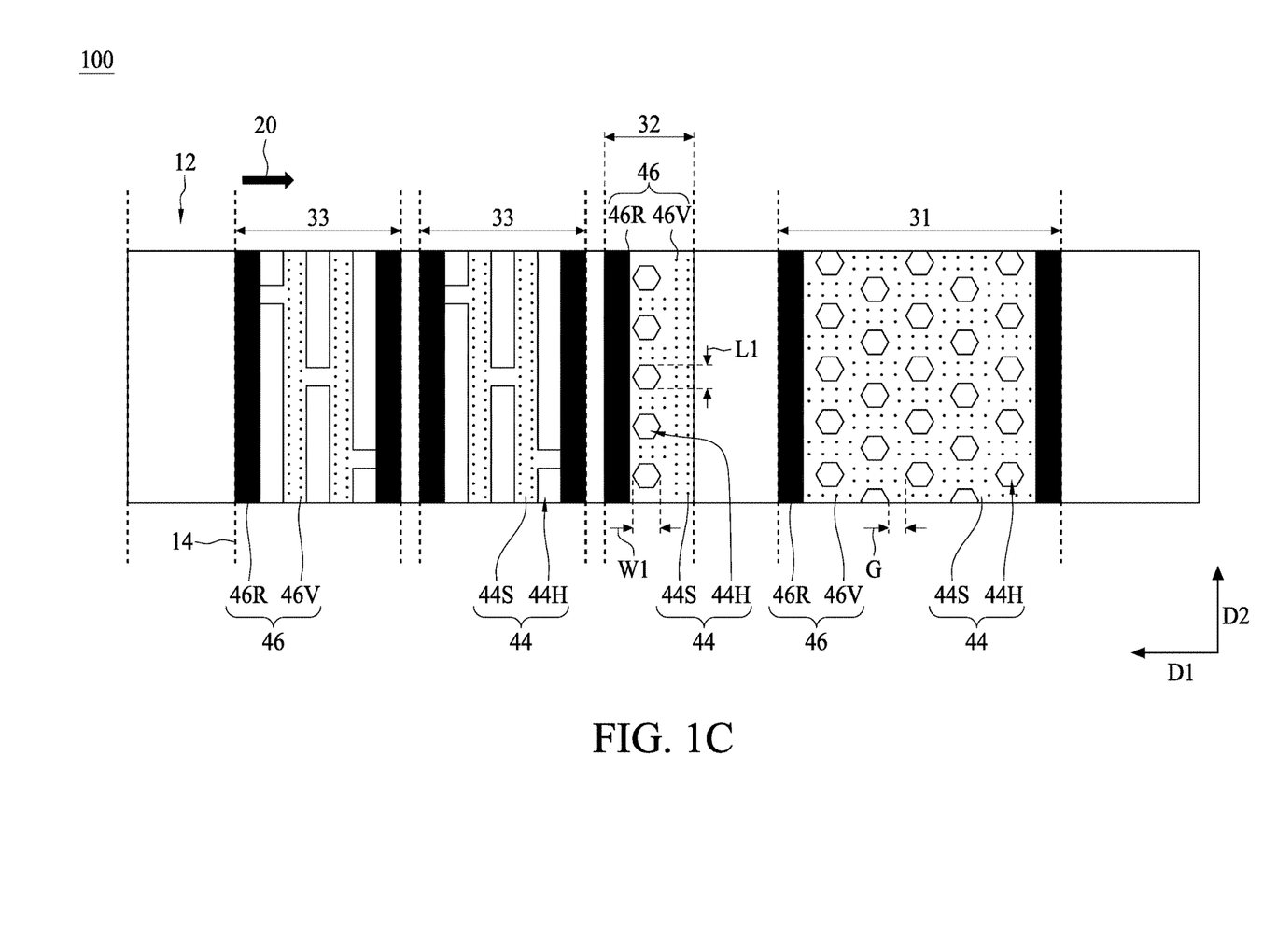
FIG. 1C is a schematic enlarged top view of some embodiments of an integrated circuit structure.

FIG. 1A is a schematic top view of some embodiments of an integrated circuit structure, FIG. 1B is a schematic cross-sectional view taken along a line A-A' in FIG. 1A, and FIG. 1C is a schematic enlarged top view of some embodiments of an integrated circuit structure. As depicted in FIGS. 1A, 1B and 1C, the integrated circuit structure 100 is formed on a substrate 10 e.g. a semiconductor substrate. In some embodiments, the material of the substrate comprises a suitable elemental semiconductor, such as silicon, diamond, or germanium; a suitable compound semiconductor, such as gallium arsenide, silicon carbide, indium arsenide, or indium phosphide; a suitable alloy semiconductor, such as silicon germanium carbide, gallium arsenic phosphide, or gallium indium phosphide. The substrate 10 may be a bulk wafer or may be a silicon-on-insulator (SOI) or similar type of substrate.

The integrated circuit structure 100 includes a scribe line (alternatively referred to as dicing line or cutting line) 12 and a semiconductor chip 20 over the substrate 10 located on an inner side of the scribe line 12. In a die sawing operation, the semiconductor chip 20 is separated along the scribe line 12 by e.g. laser cutting or blade. The scribe line boundary 14 will be accordingly formed, and can be regarded as an edge of the semiconductor chip 20. After the die sawing operation, however, the real edge of the semiconductor chip 20 may be slightly deviated from the scribe line boundary 14. By way of example, the real edge of the semiconductor chip 20 may be slightly shifted outwardly (e.g. shifted to the left side) or inwardly (e.g. shifted to the right side). The substrate 10 has an active region 10A and a seal ring region 10S. In the active region 10A resides semiconductor die 11, metal interconnect layers (not shown) and electric circuit (not shown). In the seal ring region 10S resides a seal ring structure 30. In some embodiments, the seal ring region 10S substantially surrounds the active region 10A.

In some embodiments, the substrate 10 has doped regions 16 e.g. p+ doped regions, and an inter-layer dielectric (ILD) layer 18 is over the substrate 10. The ILD layer 18 may be e.g. a silicon oxide layer, or any suitable ILD layer. Contact plugs 19 are formed in the ILD layer 18, and are electrically connected to the doped regions 16. In some embodiments, the seal ring structure 30 is electrically connected to the doped regions 16 through the contact plugs 19, and thus is connected to an electrical ground (not shown). In some embodiments, each of contact plugs 19 may form a contact ring close to the edges of semiconductor chip 20.

In some embodiments, the seal ring structure 30 is formed concurrently with the metal interconnect layers (e.g. interconnecting metal and interconnecting via) in the active region 10A. The seal ring structure 30 includes a plurality of stacked features formed in respective ones of the plurality of metal interconnect layers. In some embodiments, the stacked features comprises several stacked dielectric layers, and each of which is embedded with a metal layer and a via layer interconnected to each other. By way of example, the seal ring structure 30 includes a plurality of dielectric layers 42, metal layers 44, and via layers 46. The metal layer 44 and the via layer 46 are embedded in the respective dielectric layer 42, and the via layer 46 is underlain and connected to the respective metal layer 44.

In some embodiments, the dielectric layers 42 are low k dielectric layers. The dielectric constants (k values) of low-k dielectric layers may be e.g. lower than 3.0, or even lower than about 2.5, hence are also referred to as extreme low-k (ELK) dielectric layers. The material for the dielectric layers 42 may include organic dielectric material such as organic silicate glass (OSG), porous methyl silsesquioxane (p-MSQ), hydrogen silsesquioxane (HSQ), a combination thereof, or any other suitable organic low k or extreme low k material. In some embodiments, the material for the dielectric layers 42 may include inorganic dielectric material such as carbon-doped silicon oxide, fluorine-doped silicate glass (FSG), a combination thereof, or any other suitable inorganic low k or extreme low k material. In still some embodiments, other suitable dielectric materials, such as silicon oxide or phosphosilicate glass (PSG) may be also used. In some embodiments, the metal layers 44 and the via layers 46 are formed of various conductive materials including metallic materials e.g. copper, aluminum, tungsten, cobalt, an alloy thereof, or other suitable conductive materials.

In some embodiments, the bottom layer of the metal layers 44 may be formed using a single damascene operation. By way of example, the ILD layer 18 is patterned e.g. by photolithography and etching operations to form trench openings, and then a metallization operation, such as a metallic CVD operation or an electroplating operation is performed to fill the trench openings of the ILD layer 18 to form the bottom layer of the metal layers 44. In some embodiments, a planarization operation e.g. a chemical mechanical polishing (CMP) operation is performed to remove excessive conductive material outside the trench openings, and thus to provide an even surface for the successive fabrication. In some embodiments, upper metal layers of the metal layers 44 may be formed along with the underlying via layers 46 using a dual damascene operation. By way of example, the bottom layer of the dielectric layers 42 is patterned e.g. by photolithography and etching operations to form via openings and trench openings, where the dimension of trench opening is larger than that of via opening. Then, a metallization operation, such as a metallic CVD operation or an electroplating operation is performed to fill the via openings and trench openings of the bottom layer of the dielectric layers 42 to form the second bottom layer of the metal layers 44. In some embodiments, a planarization operation e.g. CMP operation is performed to remove excessive conductive material outside the trench openings, and thus to provide an even surface for the successive fabrication. The overlying dielectric layers 42, metal layers 44 and via layers 46 may be formed in a similar manner. In FIG. 1B, the seal ring structure 30 with seven-layered stacked structure is illustrated as an example, but the number of the stacked layers could be modified to be compatible with the number of the metal interconnect layers in the active region 10A.

In some embodiments, the seal ring structure 30 includes a first seal ring 31, a second seal ring 32, and at least one third seal ring 33 disposed over the substrate 10. The first seal ring 31 is adjacent to the active region 10A, in which the semiconductor die 11 is located. The second seal ring 32 is on an outer side of the semiconductor die 11 than the first seal ring 31 e.g. between the scribe line 12 and the first seal ring 31, the second seal ring 32 is spaced from the first seal ring 31. The third seal ring 33 is on an outer side of the semiconductor die 11 than the second seal ring 32 e.g. between the scribe line 12 and the second seal ring 32, and the third seal ring 33 is spaced from the second seal ring 32. In some embodiments, there are two third seal rings 33 between the scribe line 12 and the second seal ring 32. The widths of the seal rings and the gap therebetween may be modified based on various requirements. In some embodiments, the width of the first seal ring 31 is greater than the width of the second seal ring 32. In some embodiments, the ratio of the width of the first seal ring 31 to the width of the second seal ring 32 is about 3. By way of example, the width of the first seal ring 31 is about 5.4 micrometers, and the width of the second seal ring 32 is about 1.8 micrometers. The gap between the first seal ring 31 and the second seal ring 32 is about 1.8 micrometers, but not limited thereto. In some embodiments, the width of the third seal ring 33 is about 3 micrometers.

In some embodiments, at least one of the metal layers 44 is a metal mesh, which has a body pattern 44S and several openings 44H surrounded by the body pattern 44S. The body pattern 44S is solid portion of the metal mesh, and the openings 44H are holes of the metal mesh. In some embodiments, each of the metal layers 44 is a metal mesh including the body pattern 44S and the openings 44H. In some embodiments, the area ratio of the body pattern 44S to the metal layer 44 of the first seal ring 31 in the dielectric layer 42 is greater than or equal to about 50% and less than about 100%, and the area ratio of the body pattern 44S to the metal layer 44 of the second seal ring 32 in the dielectric layer are substantially greater than or equal to about 50% and less than about 100%. In other words, the layout density of the solid body pattern 44S (ratio of the body pattern area to the sum of body pattern area and opening area) of the first seal ring 31 and the second seal ring 32 is substantially greater than or equal to about 50% and less than about 100%. In some embodiments, the area ratio of the body pattern 44S to the metal layer 44 of the first seal ring 31 in the dielectric layer 42 substantially ranges from about 60% to about 90%, from about 70% to about 90%, or from about 70% to about 80%. In some embodiments, the area ratio of the body pattern 44S to the metal layer 44 of the second seal ring 32 in the dielectric layer 42 substantially ranges from about 60% to about 90%, from about 70% to about 90%, or from about 70% to about 80%.

In some embodiments, the area ratio of the body pattern 44S to the metal layer 44 of the first seal ring 31 in the dielectric layer 42 is substantially equal to or different from the area ratio of the body pattern 44S to the metal layer 44 of the second seal ring 32 in the dielectric layer 42. In some embodiments, the area ratio of the body pattern 44S to the metal layer 44 of the third seal ring 33 in the dielectric layer 42 is substantially equal to or different from the area ratio of the body pattern 44S to the metal layer 44 of the first seal ring 31 or the second seal ring 32 in the dielectric layer 42.

In some embodiments, the width W1 of the opening 44H in a first direction D1 extending from the semiconductor chip 20 to the scribe line 12 substantially ranges from 0.5 micrometers to 1 micrometer. The gap G between two adjacent openings 44H substantially ranges from 0.5 micrometers to 1 micrometer. In some embodiments, the opening 44H is a hole, which is through the metal layer 44 and the sidewall of the opening 44H is in a closed loop and surrounded by the body pattern 44S. The shape of the opening 44H may be modified. By way of example, the shape of the opening 44H is a hexagonal shape, but not limited thereto. In some embodiments, the ratio of the length L1 of the opening 44H in a second direction D2 substantially perpendicular to the first direction D1 to the width W1 of the opening 44H substantially ranges from about 0.5 to about 2, or substantially equal to about 1. In some embodiments, the line width of each of the segments of the body pattern 44S in the first direction D1 substantially ranges from 0.5 micrometers to 1 micrometer.

In some embodiments, the shape of openings 44H and/or the layout pattern in different metal layers 44 may be the same or different. In some embodiments, the shape of openings 44H and/or the layout pattern of the metal layers 44 in the first seal ring 31, the second seal ring 32 and/or the third seal ring(s) 33 may be the same or different. By way of example, the shape of openings 44H of the metal layers 44 in the first seal ring 31 and the second seal ring 32 is different from that in the third seal ring(s) 33.

The openings 44H of the metal layer 44 are configured to avoid issues in fabrication due to reduction in line width. For example, when the line width of the semiconductor chip 100 is reduced to 10 nanometers or even lower, metal loss issue will appear after CMP operation if the line width of the metal layer in the seal ring is far wider than the line width within the active region 10A. Metal loss issue, which is also known as metal dishing e.g. copper dishing, is a phenomenon that the central portion of the metal layer will be thinner than the peripheral portion after CMP operation. This recessed surface of the metal layer 44 renders a poor adhesion and contact with the overlying dielectric layer 42, and adversely affects the robustness and moisture blocking ability. The copper dishing gets serious when line width of the metal layer in the seal ring is far wider than line width within the active region 10A. Without the openings 44H, the width of the metal layer 44 of the seal ring is about e.g. 5 micrometers, which will cause serious metal dishing. With the openings 44H dividing the metal layer 44 into several segments, the line width of each of the segments is e.g. substantially between 0.5 micrometers and 1 micrometer, metal dishing is avoided. In some embodiments, the area ratio of the body pattern 44S to the metal layer 44 is greater than or equal to about 50% and less than about 100%, which maintains the robustness of the seal ring structure 30 and blocks moisture from attacking the semiconductor chip 100 at the same time.

In some embodiments, each of the via layers 46 comprises via rings (sometimes referred to as via bars) 46R and discrete vias 46V underlying the body pattern 44S of the metal layer 44. In some embodiments, the via ring 46R is a close-loop structure extending along the perimeter of the semiconductor chip 20. In some embodiments, each of the first seal ring 31 and the third seal ring(s) 33 has two via rings 46R respectively under two opposite perimeters, while the second seal ring 32 has one via ring 46R under one of the perimeters (e.g. the outer perimeter). In some embodiments, the discrete vias 46V of the first seal ring 31 and the third seal ring(s) 33 are located between the via rings 46R, while the discrete vias 46V of the second seal ring 32 are alongside the via ring 46R. The shape of via ring 46R and/or the discrete via 46V of all the via layers 46 in the first seal ring 31, the second seal ring 32 and/or the third seal ring(s) 33 may be the same or different.

In some embodiments, the integrated circuit structure 100 further includes a plurality of insulative layers 52 over the dielectric layer 42. The insulative layers 52 may be made of un-doped silicate glass (USG) or other suitable dielectric materials, and may be formed simultaneously with the insulative layer in the active region 10A. The insulative layers 52 are configured to improve mechanical property and prevent moisture penetration. Each of the first seal ring 31, the second seal ring 32 and the third seal ring(s) 33, in each or some of the insulative layers 52, may comprise a metal layer 54 and a via layer 56 underlying the metal layer 54. In some embodiments, the metal layer 54 of each of the first seal ring 31, the second seal ring 32 and/or the third seal ring(s) 33 includes a body pattern and several openings confined by the body pattern. In some embodiments, the opening of the metal layer 54 in the insulative layer 52 is larger than the opening 44H of the metal layer 44 in the dielectric layer 42. In some embodiments, the via layer 56 of each of the first seal ring 31, the second seal ring 32 and/or the third seal ring(s) 33, in each of the insulative layers 52, includes via rings 56R, and discrete vias 56V between the via rings 56R or alongside the via ring 56R. In some embodiments, the metal layers 54 and the via layers 56 are made of various conductive materials including metallic materials e.g. copper, aluminum, tungsten, cobalt, an alloy thereof, or other suitable conductive material. In some embodiments, the integrated circuit structure 100 further includes a first passivation layer 62 over the plurality of dielectric layers 52, and pad rings including e.g. a first pad ring 64 and a second pad ring 66 over the first passivation layer 62. The first passivation layer 62 may expose the seal ring structure 30. In some embodiments, the first passivation layer 62 exposes the top layer of the metal layer 54 of the first seal ring 31 and the third seal ring 33, the first pad ring 64 is connected to the first seal ring 31, and the second pad ring 66 is connected to the third seal ring 33. The pad rings may be made of aluminum (sometimes referred to as aluminum pad (AP)), or other suitable conductive materials. In some embodiments, the first pad ring 64 and the second pad ring 66 each is a close-loop structure extending along the perimeter of the semiconductor chip 20. In some embodiments, the first pad ring 64 and the second pad ring 66 are formed concurrently with the formation of bond pads (not shown) of the semiconductor chip 20.

In some embodiments, the integrated circuit structure 100 further includes a first passivation layer 62 over the plurality of dielectric layers 52, and pad rings including e.g. a first pad ring 64 and a second pad ring 66 over the first passivation layer 62. The first passivation layer 62 may expose the seal ring structure 30. In some embodiments, the first passivation layer 62 exposes the top layer of the metal layer 54 of the first seal ring 31 and the third seal ring 33, the first pad ring 64 is connected to the first seal ring 31, and the second pad ring 66 is connected to the third seal ring 33. The pad rings may be made of aluminum (sometimes referred to as aluminum pad (AP)), or other suitable conductive materials. In some embodiments, the first pad ring 64 and the second pad ring 66 each is a close-loop structure extending along the perimeter of the semiconductor chip 20. In some embodiments, the first pad ring 64 and the second pad ring 66 are formed concurrently with the formation of bond pads (not shown) of the semiconductor chip 20.

In some embodiments, the integrated circuit structure 100 further includes a second passivation layer 68 covering the first passivation layer 62, the first pad ring 64 and the second pad ring 66. The first passivation layer 62 and the second passivation layer 68 may be formed of insulative material e.g. oxide, nitride, and a combination thereof, and they could be formed of the same or different materials. In some embodiments, the integrated circuit structure 100 further includes a molding layer 72 covering the second passivation layer 68. The material of the molding layer 72 may include epoxy or any suitable molding materials.

In some embodiments, the integrated circuit structure 100 is sawed along the scribe line 12. The seal ring structure 30 is configured to protect the semiconductor chip 20 from stress during sawing operation.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2:
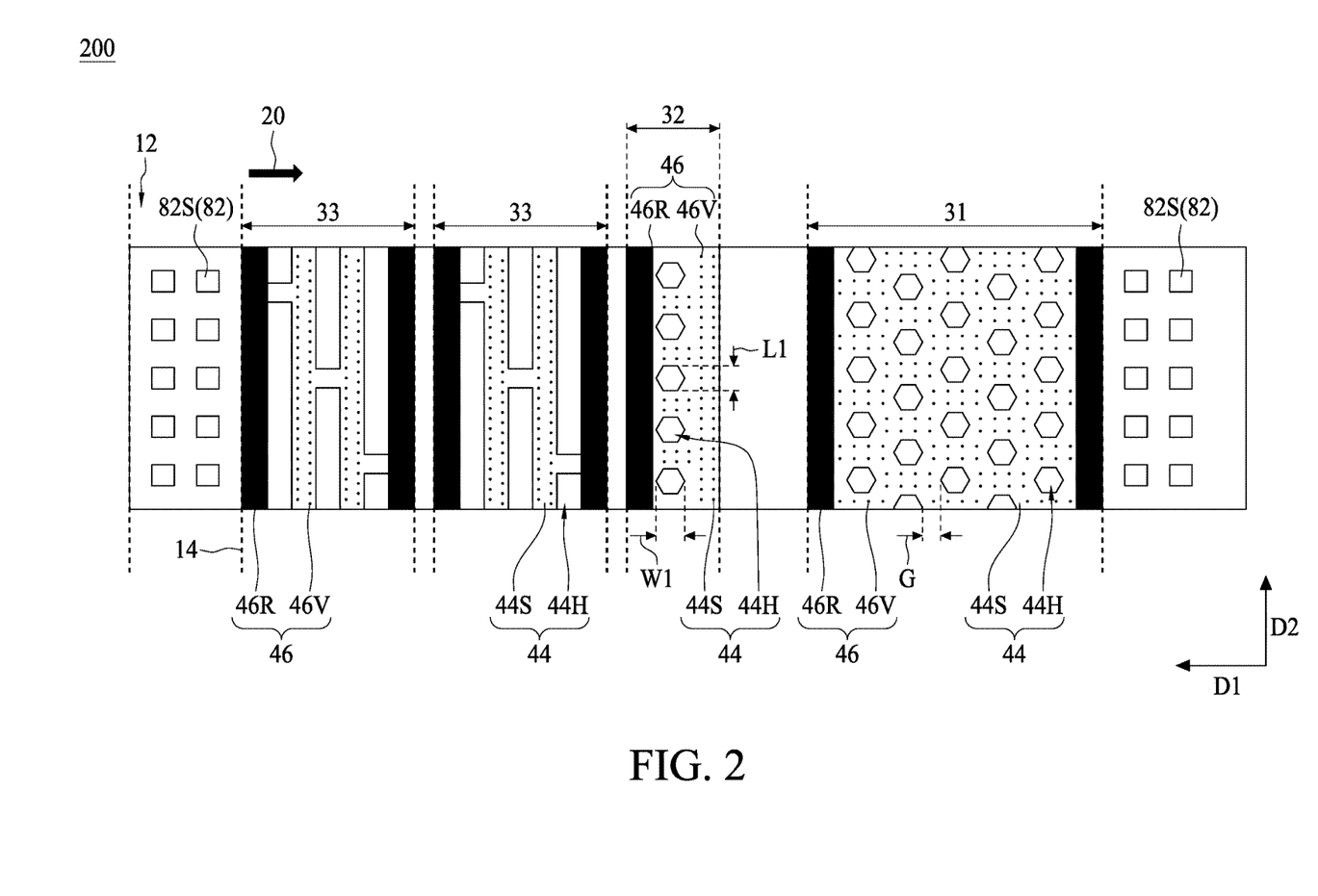
FIG. 2 is a schematic diagram of some embodiments of an integrated circuit structure.

FIG. 2 is a schematic diagram of some embodiments of an integrated circuit structure. As depicted in FIG. 2 and FIG. 1C, one difference between the integrated circuit structure 200 and the integrated circuit structure 100 is that the integrated circuit structure 200 further includes a dummy ring 82 on an inner side of the first seal ring 31. In some embodiments, the dummy ring 82, in some or each of the dielectric layers 42, includes a plurality of discrete metal features 82S aligned to line(s) having ring-like shape. The discrete metal features 82S may be formed simultaneously with the metal layer(s) 44 and/or the metal layer(s) 54 of the seal ring structure 30. The shape of the discrete metal feature 82S may be any symmetric or asymmetric geometric shapes such as triangular shape or the like. In some embodiments, the integrated circuit structure 200 further includes another dummy ring 82 on an outer side of the third seal ring 33 e.g. over the scribe line 12.

Figure 3:
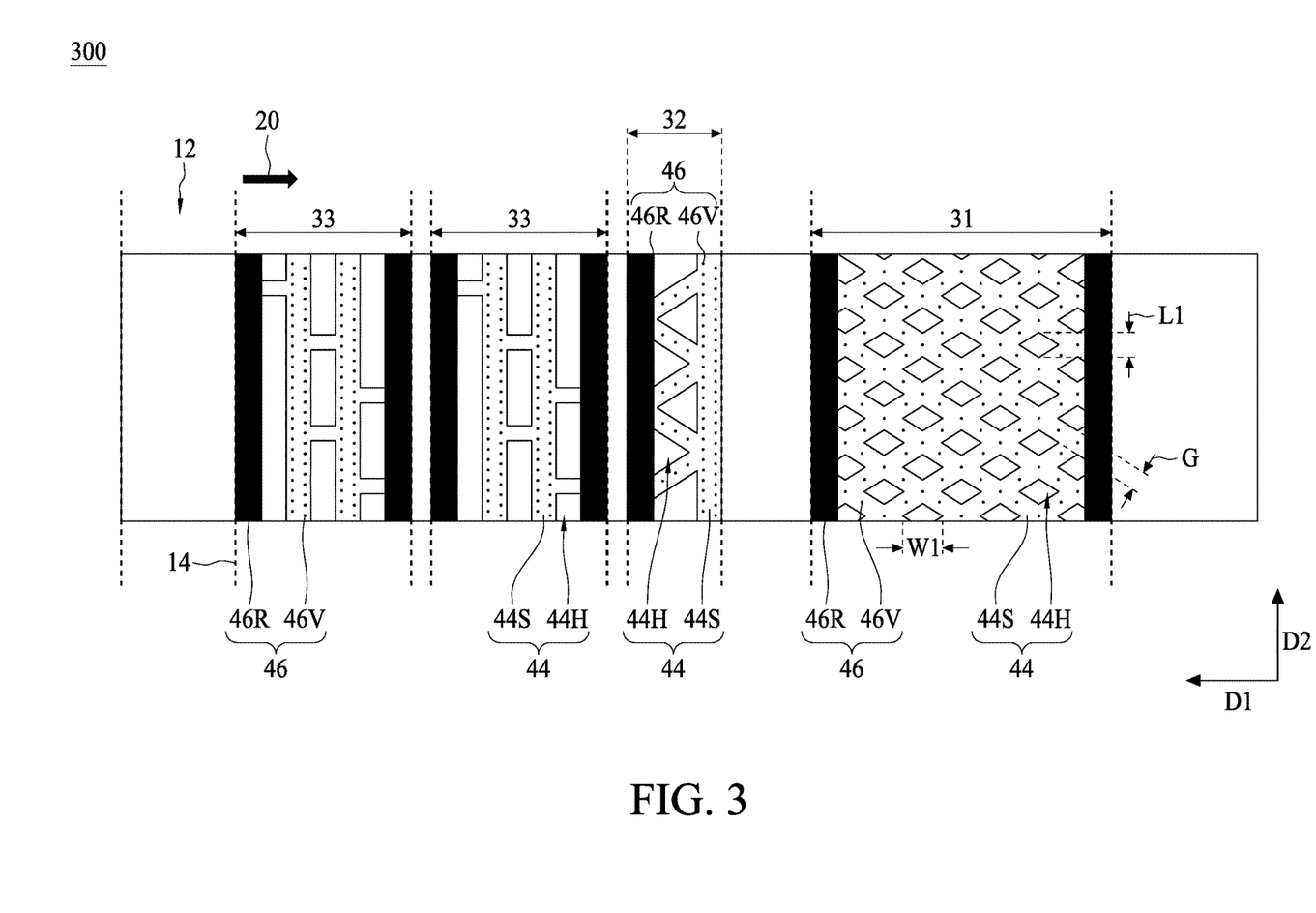
FIG. 3 is a schematic diagram of some embodiments of an integrated circuit structure.

FIG. 3 is a schematic diagram of some embodiments of an integrated circuit structure. As depicted in FIG. 3 and FIG. 1C, one difference between the integrated circuit structure 300 and the integrated circuit structure 100 is that they have different shape of the opening 44H. In some embodiments, the shapes of some of the openings 44H of the metal layer 44 e.g. the openings 44H in the first seal ring 31 and the second seal ring 32 are different. In some embodiments, the openings 44H in the first seal ring 31 and the second seal ring 32 are defined by diagonally-arranged body pattern 44S.

Figure 4:
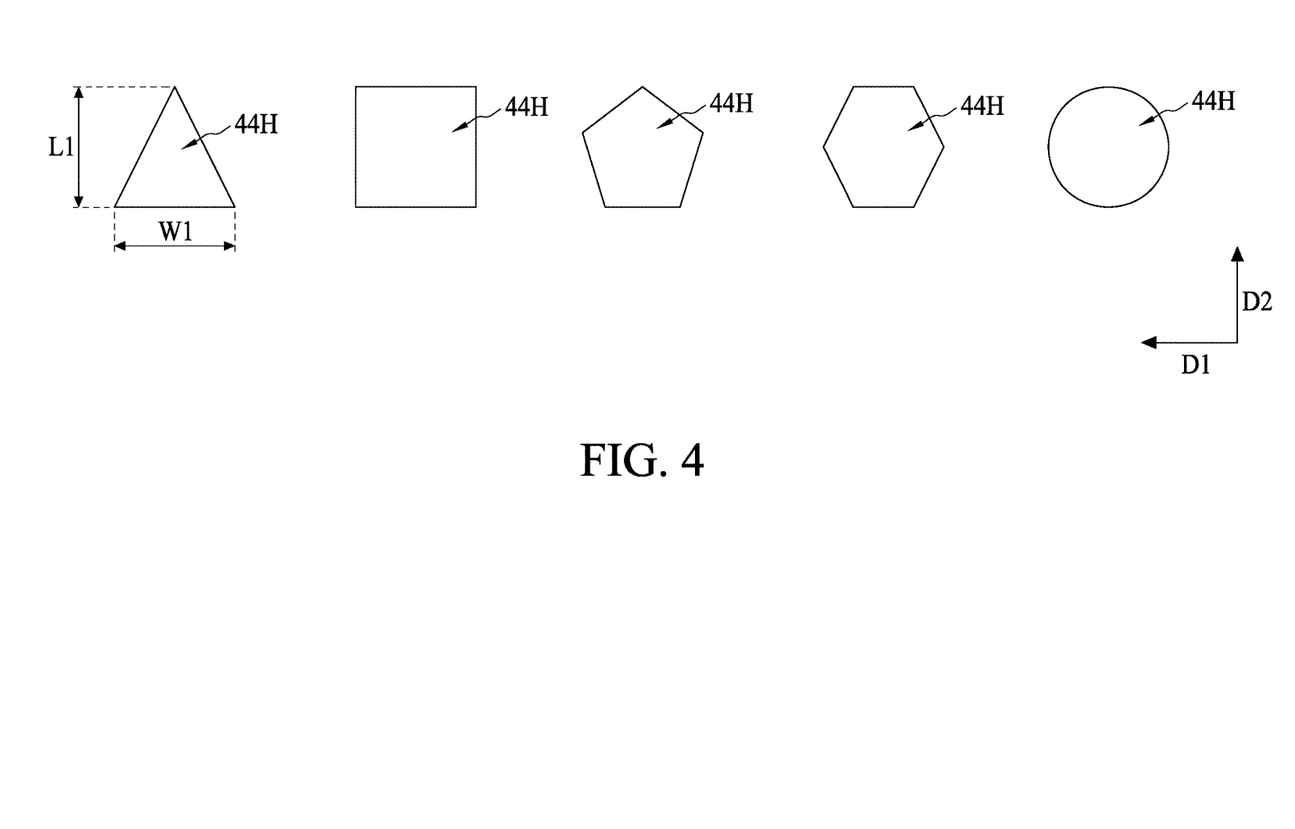
FIG. 4 is schematic diagram of some embodiments illustrating several shapes of openings in metal layer.

FIG. 4 is schematic diagram of some embodiments illustrating several shapes of openings in metal layer. As depicted in FIG. 4, the shape of opening 44H may be any geometric shapes. By way of example, the shape of opening 44H is a symmetric geometric shape e.g. triangular shape, rectangular shape (e.g. square), pentagonal shape, hexagonal shape, circular shape, or the like. In some embodiments, the ratio of length L1 to width W1 of the opening 44H is substantially about 1. In some embodiments, the width W1 and the length L1 of the opening 44H substantially ranges from 0.5 micrometers to 1 micrometer.

Figure 5:
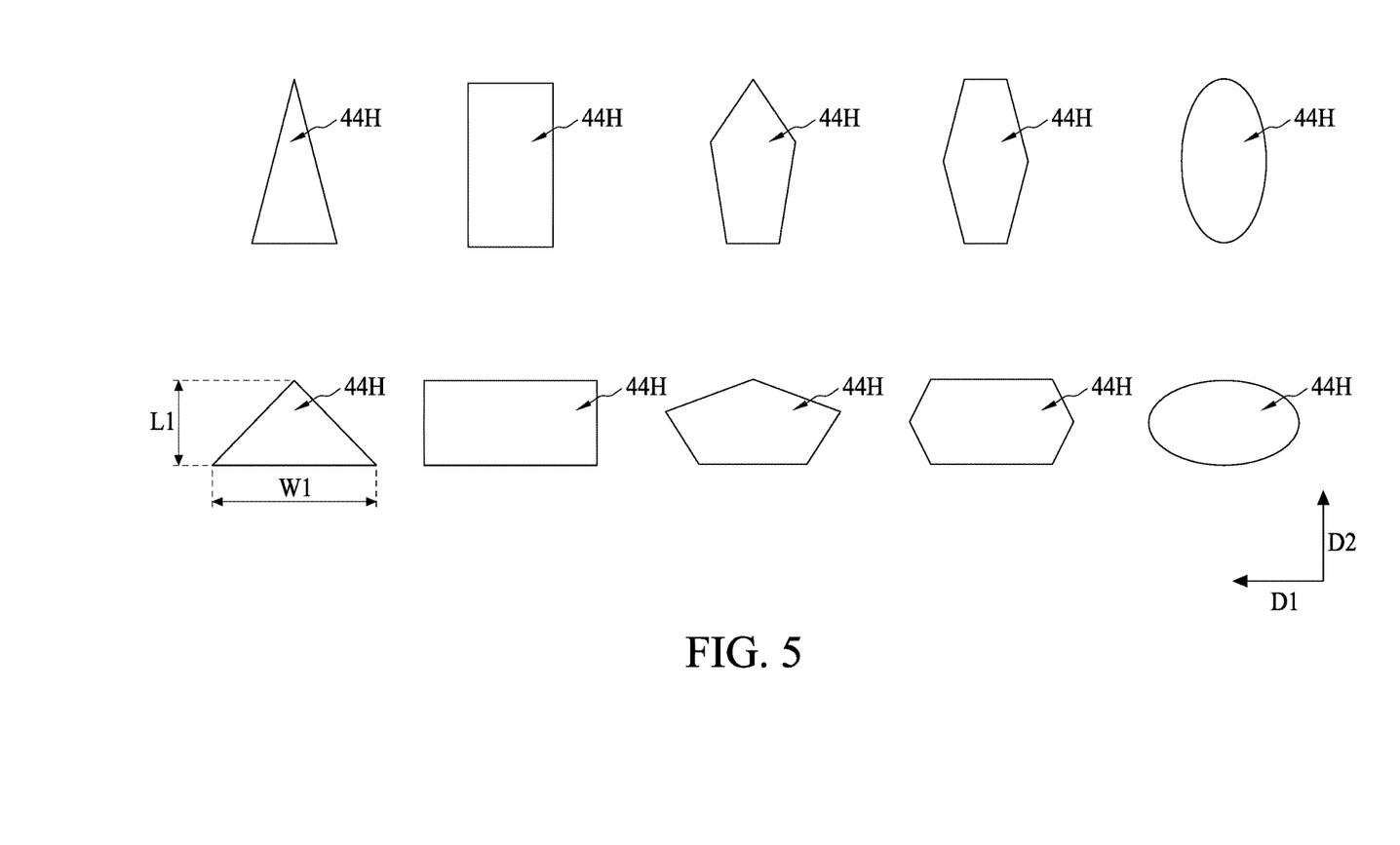
FIG. 5 is schematic diagram of some alternative embodiments illustrating several shapes of openings in metal layer.

FIG. 5 is schematic diagram of some alternative embodiments illustrating several shapes of openings in metal layer. As depicted in FIG. 5, the shape of opening 44H may be any asymmetric geometric shapes. In some embodiments, the ratio of length L1 to width W1 of the opening 44H substantially ranges from about 0.5 to about 2. In some embodiments, the width W1 and the length L1 of the opening 44H substantially ranges from 0.5 micrometers to 1 micrometer.

In the present disclosure, the metal layer(s) of the seal ring structure includes openings to prevent the metal layer from metal dishing during planarization operation. The area ratio of the body pattern to the metal layer is within a specific range e.g. substantially greater than or equal to 50% and less than 100%. Within this ratio range, the metal layer of the seal ring structure is able to avoid metal dishing issue, provide enough mechanical robustness and maintain sufficient moisture blocking ability at the same time.

In some embodiments, an integrated circuit structure is provided. The integrated circuit structure includes a substrate, and a semiconductor chip. The substrate has an outer edge. The semiconductor chip is over the substrate. The semiconductor chip includes a plurality of dielectric layers, a first seal ring, a second seal ring and a third seal ring. The second seal ring is between the outer edge and the first seal ring, and the third seal ring is between the second seal ring and the outer edge. Each of the first seal ring, the second seal ring and the third seal ring, in each of the dielectric layers, comprises a metal layer including a body pattern and a plurality of openings confined by the body pattern. The area ratio of the body pattern to the metal layer of the first seal ring in the dielectric layer and an area ratio of the body pattern to the metal layer of the second seal ring in the dielectric layer are substantially greater than or equal to 50% and less than 100%.

In some embodiments, a semiconductor device is provided. The semiconductor device includes a substrate, a semiconductor die and a seal ring structure. The substrate has an active region and a seal ring region surrounding the active region. The semiconductor die comprises a plurality of metal interconnect layers over the substrate in the active region. The seal ring structure is in the seal ring region and comprises a plurality of stacked features formed in respective ones of the plurality of metal interconnect layers. Each of the stacked features comprises a metal layer having a body pattern and a plurality of openings surrounded by the body pattern. The seal ring structure includes a first seal ring, a second seal ring and a third seal ring. The first seal ring is adjacent to the semiconductor die. The first seal ring comprises the stacked features, and a layout density of the body pattern of the first seal ring is substantially greater than or equal to 50% and less than 100%. The second seal ring is on an outer side of the semiconductor die than the first seal ring and spaced from the first seal ring. The second seal ring comprises the stacked features, and a layout density of the body pattern of the second seal ring is substantially greater than or equal to 50% and less than 100%. The third seal ring is on an outer side of the semiconductor die than the second seal ring and spaced from the second seal ring.

In some embodiments, a seal ring structure is provided. The seal ring structure includes a substrate, a low k dielectric layer, a first seal ring and a second seal ring. The low k dielectric layer is over the substrate. The first seal ring and the second seal ring are spaced from each other. The width of the first seal ring is greater than the width of the second seal ring. Each of the first seal ring and the second seal ring comprises a via layer and a metal mesh. The via layer is embedded in the low k dielectric layer, and the via layer comprises at least one via ring and a plurality of discrete vias alongside the via ring. The metal mesh is embedded in the low k dielectric layer and over the via layer. The layout density of the metal mesh is substantially greater than or equal to 50% and less than 50%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
   a substrate having an outer edge; and
   a semiconductor chip over the substrate, the semiconductor chip comprising:
      a plurality of dielectric layers; and
      a first seal ring, a second seal ring and a third seal ring, the second seal ring between the outer edge and the first seal ring, and the third seal ring between the second seal ring and the outer edge, wherein each of the first seal ring, the second seal ring and the third seal ring, in each of the dielectric layers, comprises a metal layer including a body pattern and a plurality of openings confined by the body pattern, and an area ratio of the body pattern to the metal layer of the first seal ring in the dielectric layer and an area ratio of the body pattern to the metal layer of the second seal ring in the dielectric layer are substantially greater than or equal to 50% and less than 100%.

2. The integrated circuit structure of claim 1, wherein a width of the first seal ring is greater than that of the second seal ring.

3. The integrated circuit structure of claim 1, wherein a width of the opening in a first direction extending from the semiconductor chip to the outer edge substantially ranges from 0.5 micrometers to 1 micrometer, and a gap between two adjacent openings of the openings substantially ranges from 0.5 micrometers to 1 micrometer.

4. The integrated circuit structure of claim 3, wherein a ratio of a length of the opening in a second direction substantially perpendicular to the first direction to the width of the opening substantially ranges from 0.5 to 2.

5. The integrated circuit structure of claim 1, wherein each of the first seal ring, the second seal ring and the third seal ring, in each of the dielectric layers, further comprises a via layer underlying and connected to the metal layer.

6. The integrated circuit structure of claim 5, wherein the via layer comprises via rings and discrete vias underlying the body pattern of the metal layer.

7. The integrated circuit structure of claim 6, wherein the discrete vias of the first seal ring are between the via rings of the first seal ring, and the discrete vias of the second seal ring are alongside the via ring of the second seal ring.

8. The integrated circuit structure of claim 1, further comprising a dummy ring on an inner side of the first seal ring, wherein the dummy ring, in each of the dielectric layers, comprises a plurality of discrete metal features.

9. The integrated circuit structure of claim 1, wherein the dielectric layers comprise low k dielectric layers.

10. The integrated circuit structure of claim 1, further comprising:
    a first passivation layer over the plurality of dielectric layers; and
    a first pad ring and a second pad ring over the first passivation layer, wherein the first pad ring is connected to the first seal ring, and the second pad ring is connected to the third seal ring.

11. The integrated circuit structure of claim 10, further comprising a plurality of insulative layers between the first passivation layer and the dielectric layers, wherein each of the first seal ring, the second seal ring and the third seal ring, in each of the insulative layers, comprises another metal layer, and another via layer underlying the metal layer.

12. The integrated circuit structure of claim 11, wherein the metal layer of each of the first seal ring, the second seal ring and the third seal ring, in each of the insulative layers, comprises a body pattern and a plurality of openings confined by the body pattern, and the opening of the metal layer in the insulative layer is larger than the opening of the metal layer in the dielectric layer.

13. The integrated circuit structure of claim 11, wherein the insulative layers comprise un-doped silicate glass (USG) layers.

14. An integrated circuit structure, comprising:
    a substrate having an active region and a seal ring region surrounding the active region;
    a semiconductor die comprising a plurality of metal interconnect layers over the substrate in the active region; and
    a seal ring structure in the seal ring region comprising a plurality of stacked features formed in respective ones of the plurality of metal interconnect layers, each of the stacked features comprising a metal layer having a body pattern and a plurality of openings surrounded by the body pattern, wherein the seal ring structure comprises:
       a first seal ring adjacent to the semiconductor die, wherein the first seal ring comprises the stacked features, and a layout density of the body pattern of the first seal ring is substantially greater than or equal to 50% and less than 100%;
       a second seal ring on an outer side of the semiconductor die than the first seal ring and spaced from the first seal ring, wherein the second seal ring comprises the stacked features, and a layout density of the body pattern of the second seal ring is substantially greater than or equal to 50% and less than 100%; and
       a third seal ring on an outer side of the semiconductor die than the second seal ring and spaced from the second seal ring.

15. The integrated circuit structure of claim 14, wherein a width of the first seal ring is greater than that of the second seal ring.

16. The integrated circuit structure of claim 14, wherein the opening has a width along a first direction extending from the first seal ring to the second seal ring, and a length along a second direction substantially perpendicular to the first direction, and a ratio of the length to the width of the opening ranges from 0.5 to 2.

17. The integrated circuit structure of claim 16, wherein the width of the opening substantially ranges from 0.5 micrometers to 1 micrometer, and the length of the opening substantially ranges from 0.5 micrometers to 1 micrometer.

18. The integrated circuit structure of claim 14, wherein a gap between two adjacent openings of the metal layer substantially ranges from 0.5 micrometers to 1 micrometer.

19. An integrated circuit structure, comprising:
a substrate;
a semiconductor die over the substrate;
a low k dielectric layer over the substrate; and
a first seal ring and a second seal ring spaced from each other, a width of the first seal ring being greater than a width of the second seal ring, wherein each of the first seal ring and the second seal ring comprises:
   a via layer embedded in the low k dielectric layer, the via layer comprising at least one via ring and a plurality of discrete vias alongside the via ring; and
   a metal mesh embedded in the low k dielectric layer and over the via layer,
   wherein a layout density of the metal mesh is substantially greater than or equal to 50% and less than 50%.

20. The integrated circuit structure of claim 19, wherein a ratio of the width of the first seal ring to the width of the second seal ring is about 3.

* * * * *